United States Patent [19]

Aoai et al.

[11] Patent Number: 5,576,143
[45] Date of Patent: Nov. 19, 1996

[54] LIGHT-SENSITIVE COMPOSITION

[75] Inventors: Toshiaki Aoai; Tadayoshi Kokubo, both of Shizuoka, Japan

[73] Assignee: Fuji Photo Film Co., Ltd., Kanagawa, Japan

[21] Appl. No.: 985,262

[22] Filed: Dec. 3, 1992

[30] Foreign Application Priority Data

Dec. 3, 1991 [JP] Japan ................................. 3-344085
Dec. 3, 1991 [JP] Japan ................................. 3-344112

[51] Int. Cl.$^6$ ........................... G03C 1/492; G03F 7/004
[52] U.S. Cl. ..................... 430/270.1; 430/326; 430/955
[58] Field of Search ............................... 430/270, 326, 430/955, 270.1

[56] References Cited

U.S. PATENT DOCUMENTS

| | | | |
|---|---|---|---|
| 5,069,998 | 12/1991 | Schwalm et al. | 430/270 |
| 5,110,709 | 5/1992 | Aoai et al. | 430/326 |
| 5,206,117 | 4/1993 | Labadie et al. | 430/270 |

FOREIGN PATENT DOCUMENTS

| | | | |
|---|---|---|---|
| 0412326 | 2/1991 | European Pat. Off. | |
| 0425142 | 5/1991 | European Pat. Off. | |
| 4-51243 | 2/1992 | Japan | 430/270 |

OTHER PUBLICATIONS

Patent & Trademark Office English Language Translation of Japanese Patent 4-51243 (pub. Feb. 19, 1992).

*Primary Examiner*—Janis L. Dote
*Attorney, Agent, or Firm*—Sughrue, Mion, Zinn, Macpeak & Seas

[57] ABSTRACT

A positive type or negative type light-sensitive composition providing high sensitivity and high resolution in the manufacture of a semiconductor device, and contains:

(a) a compound which has at least one group capable of decomposing by acid and a solubility that is increased in an alkaline developing solution, (b) a compound which generates acid by an irradiation with actinic rays or radiation, (c) a compound which generates a base at 50° C. or higher, and (d) a resin which is insoluble in water and soluble in an alkaline aqueous solution.

11 Claims, No Drawings

LIGHT-SENSITIVE COMPOSITION

FIELD OF THE INVENTION

The present invention relates to a positive type or negative type light-sensitive composition which is sensitive to irradiation, for example, with actinic rays or radiation, such as UV rays, far UV rays, X rays, an electron beam, a molecular beam, γ rays, and synchrotron radiation.

Moreover, the present invention relates to a photoresist, particularly to a photoresist composition for fine processing, which has high resolution and sensitivity, small performance variation during processing from exposure to development, and good storage stability.

The photoresist according to the present invention is coated on a semiconductor wafer, glass, or a substrate such as Ceramic, and metal in a coating thickness of 0.3 to 5 μm by a suitable method such as spin coating or roller coating. Then, the coated substrate is dried with heat, and a circuit pattern is printed via an exposing mask by irradiation of UV rays, followed by a post-exposure baking process (PEB), according to necessity, and then developing, whereby a positive or negative image can be obtained. Further, etching can be carried out using this image as a mask to provide the substrate with a patternwise processing.

The present invention can be applied to, for example, a manufacturing process for semiconductors such as IC, liquid crystals, manufacturing of a circuit board for a thermal head and others, and other photofabrication processes.

Further, the difference in affinity of ink to the image and substrate can be utilized for applications to a lithographic printing plate.

BACKGROUND OF THE INVENTION

A high resolution photoresist is required, as processing of semiconductor substrates moves toward high integration. However, it is known that a negative type resist consisting of a cyclized rubber and bisazide causes swelling during development which deteriorates resolution. In a positive type photoresist consisting of a novolak resin and an anti-resolution agent consisting of naphthoquinonediazide and other compounds, such swelling does not take place and a high resolution can be obtained. Accordingly, at present, in fine processing of a semiconductor lithography, the positive type resist is used, is primarily employed.

There is generally used as a positive type photoresist composition, a composition containing an alkali soluble resin and a naphthoquinonediazide compound as a light-sensitive substance. For example, a novolak type phenol resin/naphthoquinonediazide-substituted compound is disclosed in U.S. Pat. Nos. 3,666,473, 4,115,128 and 4,173,470, and an example of a novolak resin consisting of cresol-formaldehyde/trihydroxybenzophenone-1,2-naphthoquinone-diazide sulfonic acid ester as a typical composition is disclosed in "Introduction to Microlithography" written by L.F. Thompson (ACS Publication, No. 2, vol. 19, pp. 112 to 121).

A novolak resin is particularly useful for a photoresist use since it can be dissolved in an alkaline aqueous solution without swelling, and when a formed image is used as a mask for etching, it shows high durability, particularly to plasma etching. A naphthoquinonediazide compound itself used for a light-sensitive material acts as an anti-dissolution agent which lowers the alkali solubility of the novolak resin. However, it has the characteristic that it is decomposed by irradiation of light to generate an alkali soluble substance, so that it raises the alkali solubility of the novolak resin. The naphthoquinonediazide compound is particularly useful as a light-sensitive material for a positive type photoresist because of this large quality change by light irradiation.

As a result, many positive type photoresists containing the novolak resin and naphthoquinonediazide series light-sensitive material have been developed and put to practical use, and sufficient results have been obtained for line width processing of about 1.5 to 2 μm.

In an integrated circuit, however, integration thereof is increasing more and more, and in manufacturing a semiconductor substrate such as an ultra LSI, there is a need for processing an ultra fine pattern consisting of a line width of 1 μm or less. Such an application requires a photoresist having particularly high resolution, high reproduction accuracy for a pattern form to accurately reproduce a mask for exposure, high sensitivity to improve productivity, and excellent storage stability.

It has been proposed to increase the content by weight % of a quinonediazide group in order to achieve high resolution. There is described in, for example, JP-A-60-158440 (the term "JP-A" as used herein means an unexamined published Japanese patent application), a method in which a light-sensitive substance having a high polyester content is used. Further, it has been proposed in JP-A-61-118744 to increase the number of quinonediazide light-sensitive groups contained in one molecule of a light-sensitive substance.

However, there is a problem in that these light-sensitive substances are insoluble in conventional solvents and even when they are dissolved therein, the deposits are generated during the storage of a photoresist composition to cause problems at the photofabrication and device manufacturing steps, which results in a deterioration of the yield.

JP-A-61-260239 discloses a method in which an organic solvent having a solubility parameter of 11 to 12 is added in order to prevent deposition of the light-sensitive substance. However, there is a defect that the use of a solvent such as dimethylsulfoxide and others deteriorates storage stability of the photoresist composition and sensitivity and resolution are varied to a large extent over time.

In order to achieve high resolution, it has been proposed to shift the wavelength of the light source used to a shorter range. That is, it has been investigated to use conventional g rays (436 nm) and i rays (365 nm) as well as Deep-UV rays (200 to 300 nm) and KrF excimer laser light (248 nm). In order to correspond to the above wavelengths for forming a resist pattern having good configuration, there is a need for a photoresist that has small absorption in these wavelength regions and a large bleaching ability at the exposing wavelength. However, in the case of a conventional naphthoquinonediazide light-sensitive material, the requirement for shifting the wavelength of the light source to a shorter range can not be met because of the large absorption in the Deep-UV region as well as the small bleaching performance.

Further, these quinonediazide compounds are decomposed by irradiation with actinic rays to generate five membered-cyclic carboxylic acids and become alkali soluble. However, there is a defect in that the compounds have insufficient light-sensitivity. This is because the quantum yield of quinonediazide does not exceed 1.

A method for increasing light sensitivity of a light-sensitive composition containing a quinonediazide compound has been proposed, but it was too difficult to raise light sensitivity while keeping a development latitude in a development.

Meanwhile, several proposals have been made regarding a positive light-sensitive composition which acts without using a quinonediazide compound. For example, a polymer compound having an ortho-nitrocarbinol ester group is described in, for example, JP-B-56-2696 (the term "JP-B" as used herewith means an examined Japanese patent publication). In this case, however, it does not have sufficient light sensitivity for the same reason as when using the quinonediazide compound.

Further, there is a method in which a light-sensitive system, activated by contact catalysis, is used to raise light sensitivity. This is a conventional principle in which the second reaction is caused by acid generated by photodecomposition to thereby solubilize an exposed area.

Examples thereof include the combination of a compound generating acid by photodecomposition with acetal or an O, N-acetal compound (JP-A-48-89003), the combination with ortho-ester or an amidacetal compound (JP-A-51-120714), the combination with a polymer having an acetal or ketal group on a principal chain (JP-A-53-133429), the combination with an enol ether compound (JP-A-55-12995), the combination with an N-acyliminocarbonate compound (JP-A-55-126236), the combination with a polymer having an orthoester group on a principal chain (JP-A-56-17345), the combination with a silyl ester compound (JP-A-60-10247), and the combination with a silyl ether compound (JP-A-60-37549 and JP-A-60-121446). These combinations have quantum yields theoretically exceeding 1 and therefore, they have a high light sensitivity.

Similarly, a system, which is decomposed by heating in the presence of acid to become alkali soluble while remaining stable over time at room temperature, includes, for example, the combined systems of compounds generating acids by exposing and esters having tertiary or secondary carbons (for example, t-butyl and 2-cyclohexenyl) or carbonic acid esters, described in, for example, JP-A-59-45439, JP-A-60-3625, JP-A-62-229242, and JP-A-63-36240, *Polym. Eng. Sci.*, vol. 23, p. 1012 (1983), *ACS. Sym.*, vol. 242, p. 11 (1984), *Semiconductor World*, September 1987, p. 91, *Micromolecules*. vol. 21, p. 1475 (1988), and *SPIE*, vol. 920, p. 42 (1988). These systems also have high sensitivities and have small absorptions in the Deep-UV region as compared with a naphthoquinonediazide/novolak resin system. Accordingly, they can be an effective system for shifting the wavelength of a light source to a shorter range as described above.

Furthermore, there is a problem in that the (1) change in the lapse in time from after exposure until development and (2) the change in conditions (heating temperature and heating time) at the postexposure heating step (PEB) to promote decomposition by acid, both contribute to a variation in sensitivity and configuration of the resist pattern to a large extent.

In addition, in a pattern transfer for processing, it is desired according to the kinds of patterns or masks to be formed, that the resist forms a negative image rather than a positive image. A negative type resist containing a photolinking agent such as bisazide and other agents with a novolak resin is known, but there is a serious defect, in that the sectional shape of the resist pattern is an inverted trapezoid because of the narrow development latitude and the large ray absorption by the photolinking agent.

Further, there is a method in which a photo acid generating agent is added to a novolak resin in combination with an additive causing with an acid as a catalyst a curing reaction to a binder such as a novolak resin and other binders, to obtain a negative type light-sensitive resin composition. In this method, an increase in yield in the chemical reaction based on a catalytic reaction can be expected at the reaction process following exposure, and therefore the amount of a light-sensitive agent added, that is, the amount of the light absorption component, can be decreased. Accordingly, it is possible to solve the above problem of the sectional shape characteristic of the negative type image, and it is promising as a resist material for fine processing. Further, high quantum yield, that is, high sensitivity, can be expected because the reaction system is accompanied by an increase in chemical reaction yield. Accordingly, if this light-sensitive composition is used as a light-sensitive layer for lithography, it can be applied to a high sensitive printing plate suitable for exposing with a laser ray.

The following references are known for such a photocurable resin composition.

JP-B-54-23574 discloses a technique for photocuring a novolak resin in combination with a photo acid generating agent comprising an organic halogen compound.

German Patent Publication 2057473 discloses a photo acid generating agent consisting of a diazo compound and a phenol resin such as novolak as a binder for a photocurable composition consisting of methylolized melamine and others.

JP-A-60-263143 discloses a composition comprising an acid curable amino blast resin consisting of a photo acid generating agent, a melamine resin and others, and a conventional novolak resin, and describes a negative image, which is capable of aqueous development and has high heat stability.

JP-A-62-164045 discloses that an organic halogen compound having photoabsorption in the far UV region can be used as a photo acid generating agent for such a composition. Similarly, JP-A-2-52348 discloses that an organic halogen compound having a pKa value falling within a specific range is advantageous as a photo acid generating agent of a similar system.

JP-A-2-154266 discloses that oximesulfonic acid esters are effective as a photo acid generating agent for a similar photocurable composition. Further, JP-A-2-146044 discloses a composition prepared by combining a photo acid generating agent having a specific trichlorotriazine group with a novolak resin containing m-cresol of 30% or more in alkoxymelamine is advantageous for exposure with a high energy ray. Further, European Patent 397460A discloses that a novolak resin having a high degree of branching is used in a similar composition.

These publications do not contain much description regarding an acid curable light-sensitive resin composition in which the same novolak resin is used while attempting to obtain high resolution by applying it to a short wavelength. This is partly due to the fact that a lot of these publications can not be utilized as they are since a guiding principle for designing a function of a molecule and a material system for obtaining a high resolution in a negative resist is fundamentally different from that of a positive type.

It is disclosed in, for example, JP-A-2-146044 that in an acid curable type negative resist in which a novolak resin is used, one in which a novolak resin having a high m-cresol content is used gives a high residual layer rate and good pattern configuration, but this does not necessarily apply to a positive resist. Accordingly, a material must be searched by trial and error for attempting a higher resolution of an acid curable type negative resist, and it still remains difficult to precisely make a technical estimate on the relationship between the material applied and the resolution.

Further, there is a problem in the above negative type resist in which a photo acid generating agent and an acid curing agent are combined. Specifically, when the lapse of time from exposure until development is changed due to a diffusion of acid generated by irradiation of light or when the conditions (a heating temperature and a heating time) at a post-exposure baking process (PEB) are changed in order to promote acid curing, sensitivity and configuration of the resist pattern are varied to a large extent.

SUMMARY OF THE INVENTION

A first object of the present invention is to solve the above problems, and specifically, to provide a positive type or negative type photoresist composition providing high sensitivity and high resolution in the manufacture of a semiconductor device.

A second object is to provide a photoresist composition having small absorption in the Deep-UV region and which is capable of conforming to a short wavelength light source.

A third object is to provide a photoresist composition showing a small change in performance with a change in the conditions of the processing steps following exposure.

The extensive efforts made by the present inventors while considering the above various characteristics have resulted in the present invention.

That is, the objects of the present invention have been achieved by a positive type light-sensitive composition containing:

(a) a compound which has at least one acid decomposable group, whose solubility in an alkaline developer increases by the action of an acid, (b) a compound which generates acid by irradiation with actinic rays or radiation, and (c) a compound which generates a base at 50° C. or higher, or by a negative type light-sensitive composition containing:

(a') a compound which has at least one group capable of crosslinking by an action of acid, (b) a compound which generates acid by an irradiation of actinic rays or radiation, and (c) a compound which generates a base at 50° C. or higher, and (d) a resin which is insoluble in water and soluble in an alkaline aqueous solution.

Further, a preferred embodiment of the positive type light-sensitive composition of the present invention further includes the component (d), a resin which is insoluble in water and soluble in an alkaline aqueous solution.

DETAILED DESCRIPTION OF THE INVENTION

The respective components contained in the composition of the present invention will be explained below. It is noted that compounds (b), (c) and (d) have the same definitions in the positive and negative resists.

(1) Component (a) (a compound capable of decomposing by acid)

The component (a) of the present invention is a compound which has at least one group capable of decomposing by acid to form an acid decomposed compound, wherein the acid decomposed compound is more soluble in an alkaline developing solution than the compound containing the acid decomposable group.

In a preferred embodiment of the present invention, —COO—A or —Ar—O—B can represent the acid decomposable group, wherein A represents a —C($R^1$)($R^2$) ($R^3$), —Si($R^1$) ($R^2$) ($R^3$) or —C($R^4$) ($R^5$) (O$R^6$) group; B represents an A or —CO—O—A group; and $R^1$, $R^2$, $R^3$, $R^4$ and $R^5$ may be the same or different, and each represents a hydrogen atom, an alkyl group, a cycloalkyl group, an alkenyl group, and an aryl group.

The alkyl group includes a linear, branched or cyclic group and preferably a group having 1 to 8 carbon atoms. Specifically, the alkyl group includes methyl, ethyl, propyl, butyl, hexyl, octyl, isopropyl, isobutyl, and 2-ethylhexyl. These alkyl groups may be substituted with a halogen atom such as, for example, a chlorine atom, an alkoxy group having 1 to 6 carbon atoms such as, for example, methoxy, an aryl group such as, for example, phenyl, and an aryloxy group such as, for example, phenoxy. Particularly, these groups include monochloromethyl, dichloromethyl, trichloromethyl, bromomethyl, 2-chloroethyl, 2-bromoethyl, 2-methoxyethyl, 2-ethoxyethyl, phenylmethyl, and phenoxymethyl.

Examples of preferable cycloalkyl groups include a group having 3 to 8 carbon atoms, and in particular, cyclopropyl, cyclobutyl, cyclopentyl, cyclohexyl, cycloheptyl, cyclooctyl, cyclopentenyl, and cyclohexenyl.

Examples of preferable alkenyl group include, for example, a vinyl group and substituted alkenyl groups such as a vinyl group substituted with an alkyl group, for example, methyl and an aryl group, for example, phenyl. Specific examples include 1-methylvinyl, 2-methylvinyl, 1,2-dimethylvinyl, 2-phenylvinyl, 2-(p-methylphenyl) vinyl, 2-(p-methoxyphenyl) vinyl, and 2-(o-chlorophenyl) vinyl.

Preferred aryl groups include a monocyclic or dicyclic group, and examples include phenyl, α-naphthyl, and β-naphthyl. The aryl groups also include, for example, a group substituted with an alkyl group having 1 to 6 carbon atoms such as, for example, methyl and ethyl, an alkoxy group having 1 to 6 carbon atoms such as, for example, methoxy and ethoxy, a halogen atom such as, for example, a chlorine atom, a nitro group, a phenyl group, and a cyano group. Specific examples include a 4-chlorophenyl, 2-chlorophenyl, 4-bromophenyl, 4-nitrophenyl, 4-phenylphenyl, 4-methylphenyl, 2-methylphenyl, 4-ethylphenyl, 4-methoxyphenyl, 2-methoxyphenyl, 4-ethoxyphenyl, 4-cyanophenyl, 4-methyl-1-naphthyl, 4-chloro-1-naphthyl, 5-nitro-1-naphthyl, 6-chloro-2-naphthyl, and 4-bromo-2-naphthyl.

$R^6$ represents an alkyl or aryl group, preferably an alkyl group having 1 to 20 carbon atoms, or an aryl group having 6 to 15 carbon atoms, and more preferably an alkyl group having 1 to 8 carbon atoms, or an aryl group having 6 to 10 carbon atoms. Examples of these groups include a group substituted with a halogen atom, an alkoxy group, a nitro group, and a cyano group.

There is a proviso that at least two of $R^1$ to $R^3$ are groups other than a hydrogen atom and at least two groups of $R^1$ to $R^3$ and $R^4$ to $R^6$ may be combined to form a ring.

Ar represents a monocyclic or polycyclic divalent aromatic group.

Examples of the acid decomposable group used in the present invention include a silyl ether group, a cumyl ester group, an acetal group, an enol ether group, an enol ester group, a tertiary alkyl ether group, a tertiary alkyl ester group, and a tertiary alkyl carbonate group.

The compound (a) is preferably a low molecular weight compound having a molecular weight of 2000 or less. Further, the polymers having the structural units represented by the following formulas ($I_0$) to ($V_0$) are further examples of compound (a):

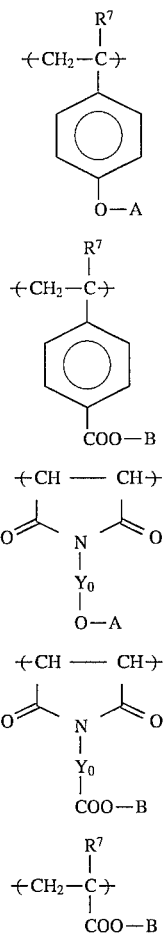

($I_0$)

($II_0$)

($III_0$)

($IV_0$)

($V_0$)

In the above formulas, A and B have the same definitions as A and B described above, and $R^7$ represents a hydrogen atom or an alkyl. $R^7$ is preferably a hydrogen atom or an alkyl group having 1 to 4 carbon atoms, more preferably a hydrogen atom or methyl. $Y^0$ represents a single bond or a divalent aromatic group, preferably a single bond or an arylene group having 6 to 15 carbon atoms, and particular examples include phenylene and naphthylene.

Examples of compounds (a) include the silyl ether compounds described in JP-A-60-37549 and JP-A-1-106038; the acetal compounds described in JP-A-51-120714 and JP-A-1-106038, JP-A-1-106041; the cumyl ester compounds described in JP-A-60-3625; the enol ether compounds described in JP-A-55-12995; and the t-butyl ether, t-butyl ester and t-butyl carbonate compounds described in JP-A-62-27827.

In addition to the above compounds, suitable compounds (a), having an acid decomposable group according to the present invention, include the monoketal products of the β-dicarbonyl compounds described in JP-A-2-177031, the β-keto acid ester compounds described in JP-A-2-181150, the malonic acid ester compounds described in JP-A-2-181151, the spiro orthocarbonate compounds described in JP-A-3-107163, the carbamate compounds described in JP-A-3-153257, the compounds having an ammonium salt group, described in European Patent 412457, the tetrahydropyranyl ether compounds described in European Patent 424124, and the compounds described in JP-A-3-17653.

Further compounds (a) include a polymer represented by poly(p-t-butylcarbonyloxystyrene) described in JP-A-59-45439; a polymer represented by poly[N-(t-butoxycarbonyl) maleimide-CO-styrene] described in JP-A-62-22924 and *SPIE*, vol. 631, p. 68 (1986); a polymer represented by poly[N-(t-butoxycarbonyloxyphenyl) maleimide-CO-styrene] described in JP-A-63-36240 and *ACS Symp.*, vol. 346, p. 200 (1987); a polymer represented by poly(t-butyl-p-vinylbenzoate) described in *SPIE*, vol. 771, p. 24 (1987); the polymers represented by poly(t-butyl methacrylate), poly(2-cyclohexenyl methacrylate), poly(2-cyclopropyl-propyl methacrylate), and poly(2-phenyl-propyl methacrylate) each described in *Macromolecules*, vol. 21, p. 14755 (1988); a polymer represented by poly(p-trimethylsiloxystyrene) described in JP-A-60-52845 and *SPIE*, vol. 926, p. 162 (1988); a polymer represented by poly(p-t-butoxystyrene) described in JP-A-63-250642; a polymer represented by poly(p-2-cyclohexenyloxystyrene) described in Polymer Bull., vol. 20, p. 427 (1988); a polymer represented by poly(p-2-pyranyloxystyrene) described in *ACS Polym. Matter. Sci. Tech.*, 61, p. 417 (1989); and a polymer represented by poly(silyl methacrylate) described in JP-A-62-40450.

Further examples of compound (a) also include polyphthalaldehyde described in *ACS Symp.*, vol. 242, p. 11 (1984), and polycarbonates described in JP-A-62-136638, *J. Imaging Sci.*, vol. 30, p. 59 (1986), and *Makromol. Chem., Rapid Commun.*, vol. 7, p. 121 (1986).

A preferred molecular weight of these polymers is 2,000 or more, more preferably 5,000 to 500,000 in terms of a weight average.

The content of the component (a) in the light-sensitive composition of the present invention is 3 to 99.9% by weight, preferably 5 to 95% by weight, and more preferably 10 to 90% by weight based on the total amount of solid matter.

(2) Component (b) (the compound generating acid by irradiation with actinic light or radiation).

There can be suitably selected and used as the compound (b) used in the present invention, which is decomposed by an irradiation of actinic light or radiation to generate acid, a photoinitiator for a photocationic polymerization, a photoinitiator for a photoradical polymerization, a photodecoloring agent for a dye, a photodiscoloring agent, a conventional compound used for a microresist, which generates acid by an irradiation of light, and the mixture thereof.

Examples of compound (b) include the diazonium salts described in *Photogr. Sci. Eng.*, by S. I. Schlesinger, vol. 18, p. 387 (1974), and *Polymer*, by T. S. Bal et al, vol. 21, p. 423 (1980); the ammonium salts described in U.S. Pat. Nos. 4,069,055, 4,069,056, and U.S. Pat. No. Re 27,992, and JP-A-3-140140; the phosphonium salts described in *Macromolecules*, by D. C. Necker et al, vol. 17, p. 2468 (1984), *Tech. Proc. Conf. Rad. Curing ASIA*, by C. S. Wen et al, p. 478, Tokyo (Oct. 1988), and U.S. Pat. Nos. 4,069,055 and 4,069,056; the iodonium salts described in *Macromolecules*, by J. V. Crivello et al, vol. 10 (6), p. 1307 (1977), *Chem. & Eng. News*, November, vol. 28, p. 31 (1988), European Patent 104,143, U.S. Pat. Nos. 339,049 and 410,201, and JP-A-2-150848 and JP-A- 2-296514; the sulfonium salts described in *Polymer J.*, by J. V. Crivello et al, vol. 17, p. 73 (1985), *J. Org. Chem.*, by J. V. Crivello et al, vol. 43, p. 3055 (1978), *J. Polymer Sci., Polymer Chem. Ed.*, by W. R. Watt et al, vol. 22, p. 1789 (1984), *Polymer Bull.*, by J. V. Crivello et al, vol. 14, p. 279 (1985), *Macromolecules*, by J. V. Crivello et al, vol. 14 (5), p. 1141 (1981), *J. Polymer Sci., Polymer Chem. Ed.*, by J. V. Crivello et al, vol. 17, 2877 (1979), European Patents 370,693, 3,902,114, 233,567, 297, 443, and 297,442, U.S. Pat. Nos. 4,933,377, 339,049, 4,760, 013, 4,734,444, and 2,833,827, and German Patents 2,904, 626, 3,604,580, and 3,604,581; the selenonium salts described in *Macromolecules*, by J. V. Crivello et al, vol. 10 (6), p. 1307 (1977), and *J. Polymer Sci., Polymer Chem. Ed.*, by J.V. Crivello et al, vol. 17, p. 1047 (1979); the onium salts such as the arsonium salts described in *Tech. Proc. Conf. Rad. Curing ASIA*, by C. S. Wen et al, p. 478, Tokyo (October 1988 ); the organic halogenated compounds described in U.S. Pat. No. 3,905,815, JP-B-46-4605, and JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organic metal/organic halogenated compounds described in *J. Rad. Curing*, by K. Meier et al, vol. 13 (4), p. 26 (1986), *Inorg. Chem.*, by T. P. Gill et al, vol. 19, p. 3007 (1980), *Acc. Chem. Res.*, by D. Astruc, vol. 19 (12), p. 377 (1896), and JP-A-2-161445; the photo-acid-generating agents having an o-nitrobenzyl type protective group, described in *Polymer Sci.*, by S. Hayase et al, vol. 25, p. 753 (1987), *J. Polymer Sci., Polymer Chem. Ed.*, by E. Reichmanis et al, vol. 23, p. 1 (1985), *J. Photo-chem.*, by Q. Q. Zhu et al, vol. 36, pp. 85, 39 and 317 (1987), *Tetrahedron Lett.*, by B. Amit et al, vol. (24), p. 2205 (1973), *J. Chem. Soc.*, by D. H. R. Barton et al, p. 3571 (1965), *J. Chem. Soc.*, Perkin I, by P. M. Collins et al, p. 1695 (1975), *Tetrahedron Lett.*, by M. Rudinstein et al, vol. (17), p. 1445 (1975), *Am. Chem. Soc.*, by J. W. Walker et al, vol. 110, p. 7170 (1988), *J. Imaging Technol.*, by S. C. Busman et al, vol. 11 (4), p. 191 (1985), *Macromolecules*, by H. M. Houlihan et al, vol. 21, p. 2001 (1988), *J. Chem. Soc., Chem. Commun.*, by P. M. Colloins et al, p. 532 (1972), *Macromolecules*, by S. Hayase et al, vol. 18, p. 1799 (1985), *J. Electrochem. Soc. Solid State Sci. Technol.*, by E. Reichmanis et al, p. 130 (6), *Macromolecules*, by F. M. Houlihan et al, vol. 21, p. 2001 (1988), European Patents 0290,750, 046,083, 156,535, 271,851, and 0,388,343, U.S. Pat. Nos. 3,901,710 and 4,181,531, and JP-A-60-198538 and JP-A-53-133022; the compounds which are subjected to a photodecomposition to generate sulfonic acid, represented by iminosulfonate, described in *Polymer Preprints Japan*, by M. Tunooka et al, p. 35 (8), *J. Rad. Curing*, by G. Berner et al, vol. 13 (4), *Coating Technol.*, by M. J. Mijs et al, vol. 55 (697), p. 45 (1983), *Polymer Preprints Japan*, by H. Adachi et al, p. 37 (3), European Patents 0199,672, 84515, 199,672, 044,155, and 0101,122, U.S. Pat. Nos. 618,564, 4,371,605, and 4,431,774, and JP-A-64-18143, JP-A-2-245756, and JP-A-3-140109; and the disulfon compounds described in JP-A-61-166544.

Further, there can also be used compounds in which these groups or compounds each generating acid by light are introduced into a primary chain or a side chain of a polymer, for examples, the compounds described in *J. Am. Chem. Soc.*, by M. E. Woodhouse et al, vol. 104, p. 5586 (1982), *J. Imaging Sci.*, by S. P. Pappas et al, vol. 30 (5), p. 218 (1986), *Makromol. Chem., Rapid Commun.*, by S. Kondo et al, vol. 9, p. 625 (1988), *Makromol. Chem.*, by Y. Yamada et al, vol. 152, pp. 153, 163 (1972), *J. Polymer Sci., Polymer Chem. Ed.*, by J. V. Crivello, vol. 17, p. 3845 (1979), U.S. Pat. No. 3,849,137, German Patent 3914407, and JP-A-63-26653, JP-A-55-164824, JP-A-62-69263, JP-A-63-146038, JP-A-63-163452, JP-A-62-153853, and JP-A-63-146029.

Further examples include compounds (b) generating acid by light, described in *Synthesis*, by V. N. R. Pillai, vol. (1), p. 1 (1980), *Tetrahedron Lett.*, by A. Abad et al, vol. (47), p. 4555 (1971), *J. Chem. Soc.*, by D. H. R. Barton et al, vol. (C), p. 329 (1970), U.S. Pat. No. 3,779,778, and European Patent 126,712.

Of the above compounds (b) which are decomposed by irradiation with actinic rays or radiation to generate acids, the compounds which can be particularly effectively used will be explained below.

(1) An oxazole derivative which is substituted with a trihalomethyl group, represented by the following formula (I), or an S-triazine derivative represented by formula (II):

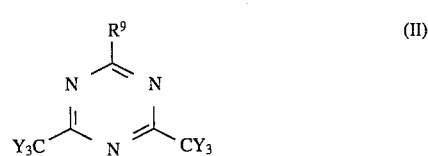

wherein $R^8$ represents a substituted or unsubstituted aryl group, or an alkenyl group; $R^9$ represents a substituted or unsubstituted aryl group, an alkenyl group, an alkyl group, or $-CY_3$; and $Y_3$ represents a chlorine atom or a bromine atom.

The following compounds can be mentioned as examples of compound (b), but the present invention is not limited thereto.

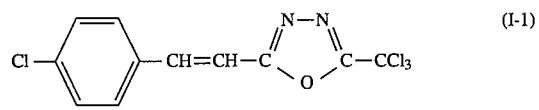

(I-1)

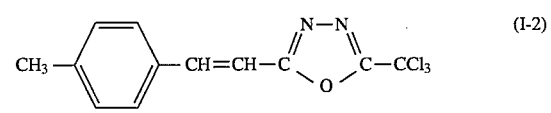

(I-2)

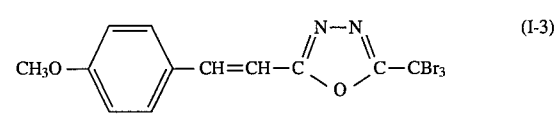

(I-3)

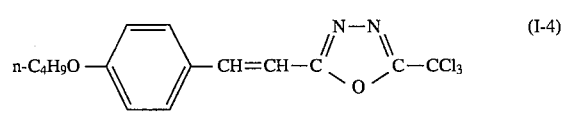

(I-4)

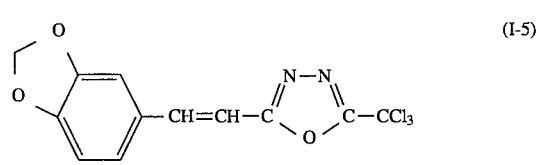

(I-5)

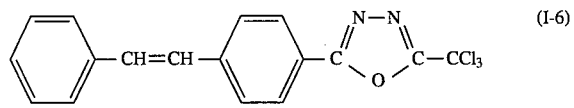

(I-6)

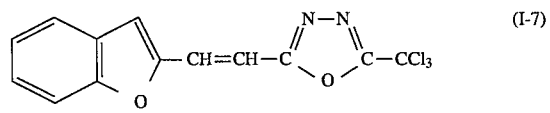

(I-7)

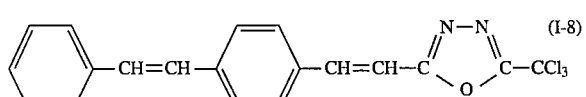

(I-8)

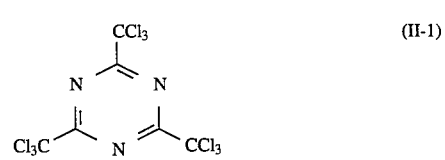

(II-1)

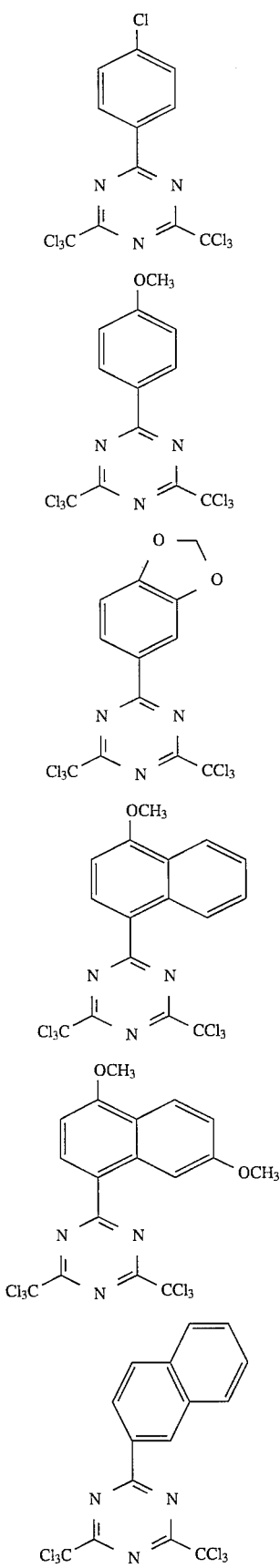

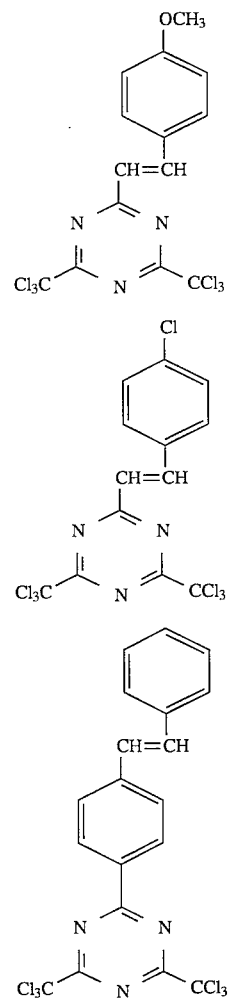

(2) An iodonium salt represented by the following formula (III) or a sulfonium salt represented by formula (IV):

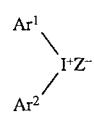

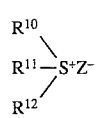

In the above formulas, $Ar^1$ and $Ar^2$ each represents a substituted or unsubstituted aryl group. Preferred substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^{10}$, $R^{11}$ and $R^{12}$ each independently represents a substituted or unsubstituted alkyl group and an aryl group. Preferred are an aryl group having 6 to 14 carbon atoms, an alkyl group having 1 to 8 carbon atoms, and a substituted derivative thereof. A preferred substituent is an alkoxy group having 1 to 8 carbon atoms, an alkyl group having 1 to 8 carbon atoms, a nitro group, a carboxyl group, a hydroxy group, and a halogen atom for the aryl group, and an alkoxy group having 1 to 8 carbon atoms, a carboxyl group, and an alkoxycarbonyl group for the alkyl group.

$Z^-$ represents a paired anion, for example, a perfluoroalkanesulfonic acid anion such as $BF_4^-$, $AsF_6^-$, $PF_6^-$, $SbF_6^-$, $SiF_6^-$, $ClO_4^-$, and $CF_3SO_3^-$, $BPh_4^-$, a condensed polynuclear aromatic sulfonic acid anion such as a naphthalene-1-sulfonic acid anion, an anthraquinonesulfonic acid anion, and a dye containing a sulfonic acid group, but the present invention is not limited thereto.

At least two of $R^{10}$, $R^{11}$ and $R^{12}$, $Ar^1$ and $Ar^2$ may be combined via a single bond or substituent thereof.

The following compounds can be mentioned as examples of component (b), but the present invention is not limited thereto.

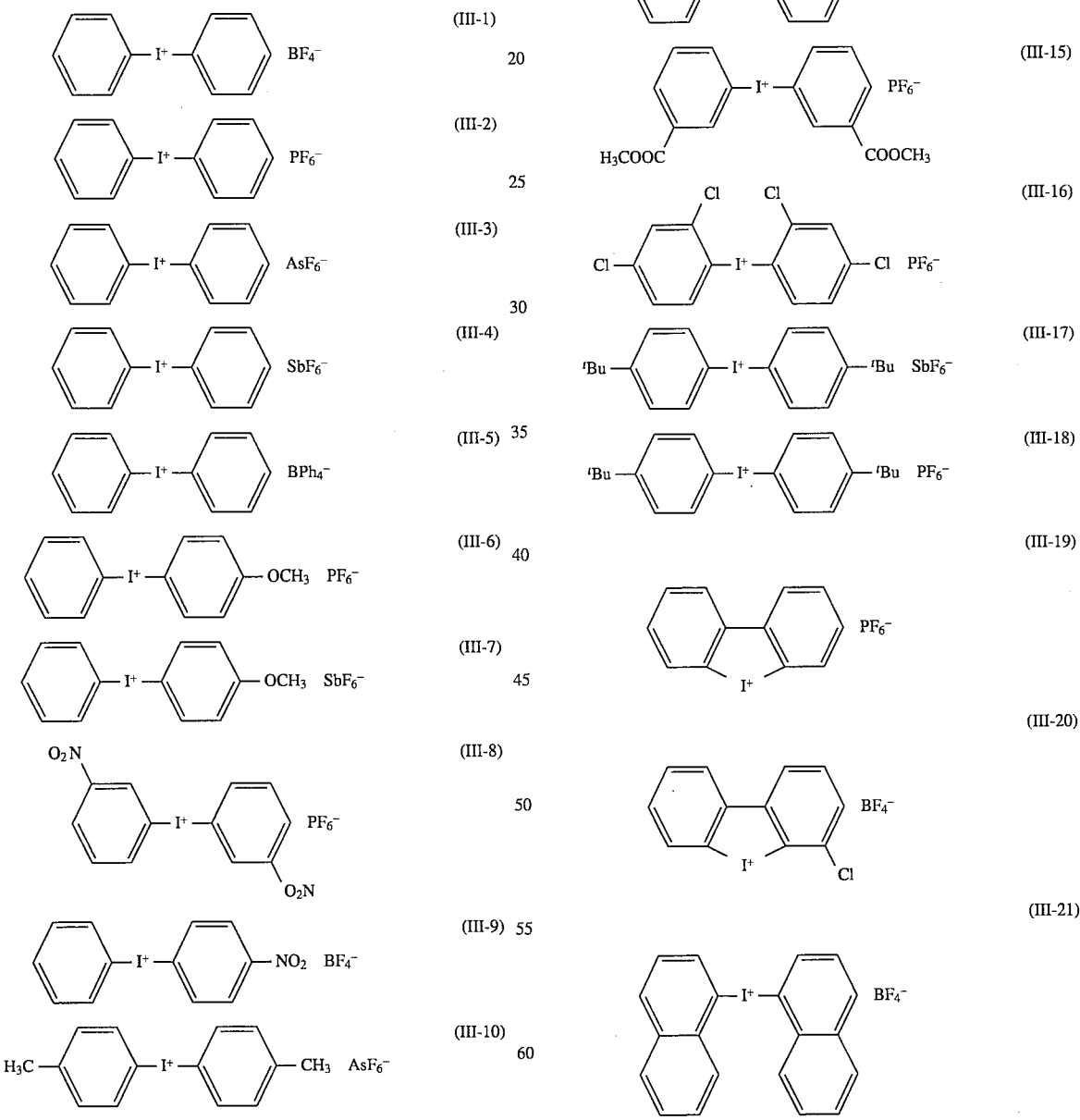

-continued (III-22), (III-23), (III-24), (III-25), (III-26), (III-27) — structures of diaryliodonium salts with various sulfonate counterions (including anthracene-9,10-dimethoxy-2-sulfonate, 4-ethoxynaphthalene-1-sulfonate, 8-anilinonaphthalene-2-sulfonate, pyrene-2-sulfonate, 9,10-anthraquinone-2-sulfonate, and 2-methoxy-5-benzoylbenzenesulfonate).

-continued (IV-1) $(C_6H_5)_3S^+ \; BF_4^-$ (IV-2) $(C_6H_5)_3S^+ \; PF_6^-$ (IV-3) $(C_6H_5)_3S^+ \; AsF_6^-$ (IV-4) $(C_6H_5)_3S^+ \; SbF_6^-$ (IV-5) $(C_6H_5)_3S^+ \; CF_3SO_3^-$ (IV-6) $H_3C$–$C_6H_4$–$S^+(C_6H_4$–$OC_2H_5)_2 \; BF_4^-$ (IV-7) $H_3CO$–$C_6H_4$–$S^+(C_6H_4$–$Cl)_2 \; BF_4^-$ (IV-8) $C_6H_5$–$S^+(CH_3)$–$CH_2Cl \; BF_4^-$ (IV-9) $HO$–$C_6H_4$–$S^+(CH_3)_2 \; PF_6^-$ (IV-10) 3-methyl-4-hydroxyphenyl dimethylsulfonium $BF_4^-$ (IV-11) 3,5-dimethyl-4-hydroxyphenyl dimethylsulfonium $SbF_6^-$ (IV-12) 4-hydroxyphenyl tetramethylenesulfonium $BF_4^-$ (IV-13) 3,5-dimethoxy-4-hydroxyphenyl tetramethylenesulfonium $BF_4^-$

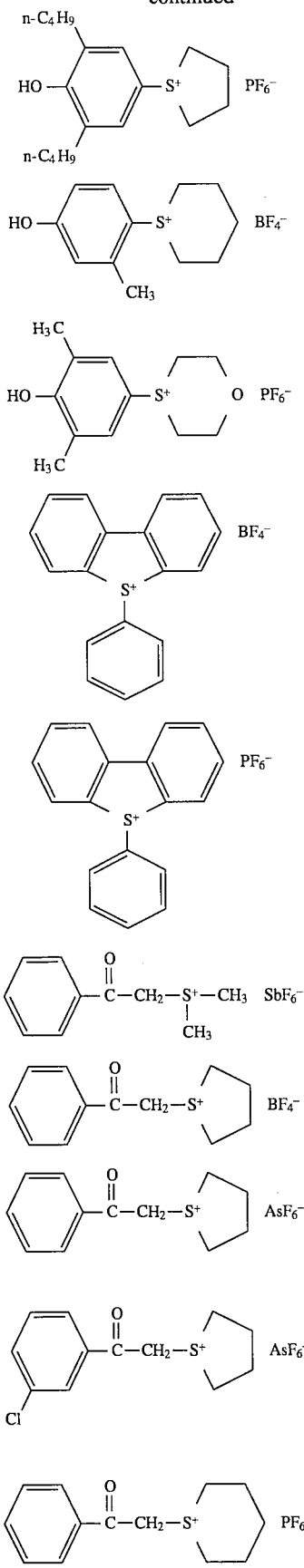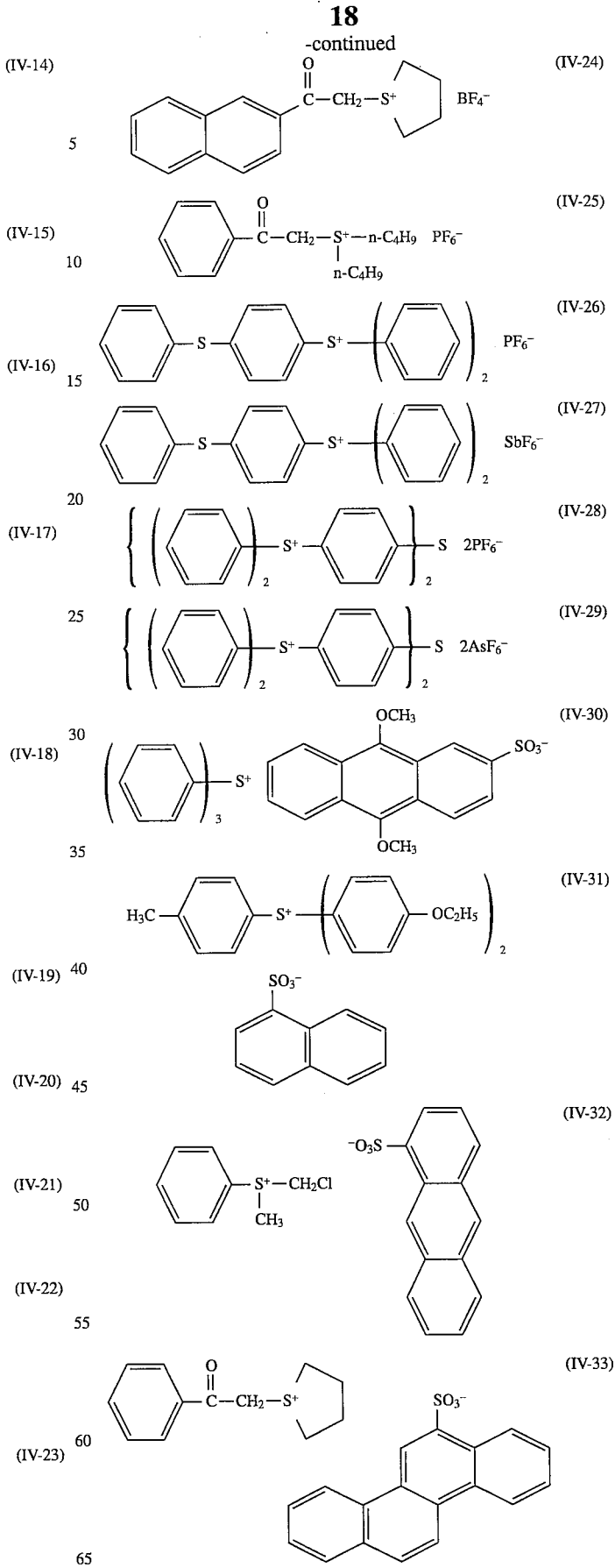

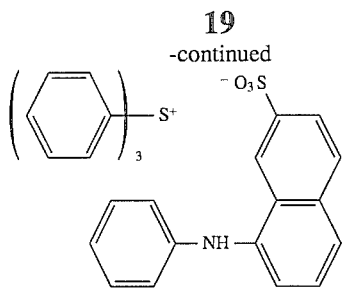 (IV-34)

The above onium salts represented by formulas (III) and (IV) are publicly known and can be synthesized by the methods described in, for example, *J. Am. Chem. Soc.*, by J. W. Knapczyk et al, vol. 91, p. 145 (1969), *J. Org. Chem.*, by A. L. Maycok et al, vol. 35, p. 2532 (1970), *Bull. Soc. Chem. Belg.*, by E. Goethas et al, vol. 73, p. 546 (1964), *J. Am. Chem. Soc.*, by H. M. Leicester, vol. 51, p. 3587 (1929), *J. Polym. Chem. Ed.*, by J. V. Ceivello et al, vol. 18, p. 2677 (1980), U.S. Pat. Nos. 2,807,648 and 4,247,473, and JP-A-53-101331.

(3) A disulfonic acid derivative represented by the following formula (V) or an iminosulfonate derivative represented by formula (VI):

$$Ar^3-SO_2-SO_2-Ar^4 \quad (V)$$

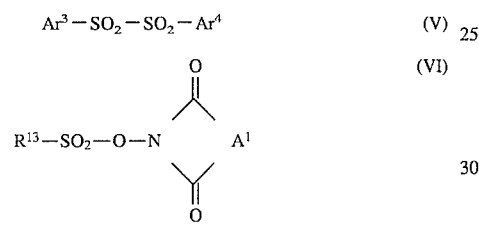 (VI)

wherein $Ar^3$ and $Ar^4$ each independently represents a substituted or unsubstituted aryl group; $R^{13}$ represents a substituted or unsubstituted alkyl group or an aryl group; and $A^1$ represents a substituted or unsubstituted alkylene group, an alkenylene group, or an arylene group.

The following compounds can be mentioned as concrete examples of component (b), but the present invention is not limited thereto.

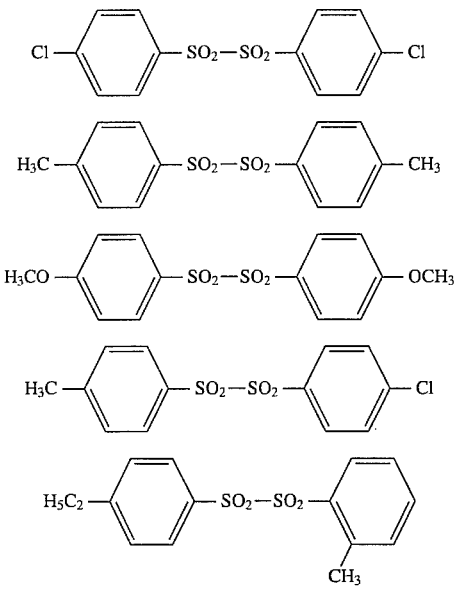

(V-1)
(V-2)
(V-3)
(V-4)
(V-5)

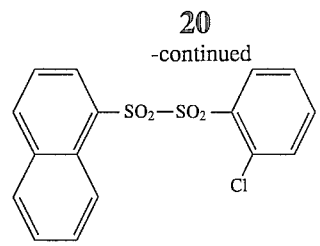 (V-6)

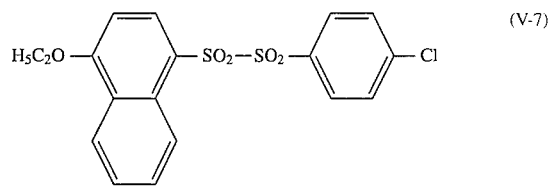 (V-7)

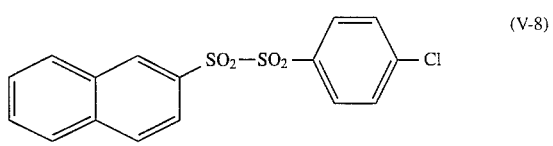 (V-8)

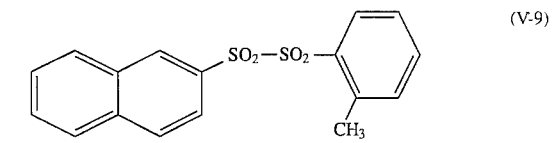 (V-9)

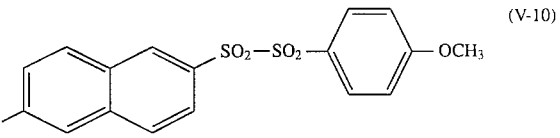 (V-10)

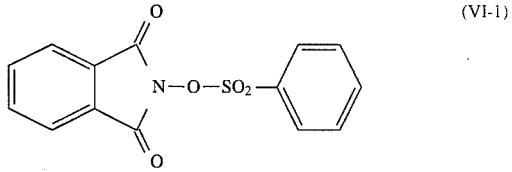 (VI-1)

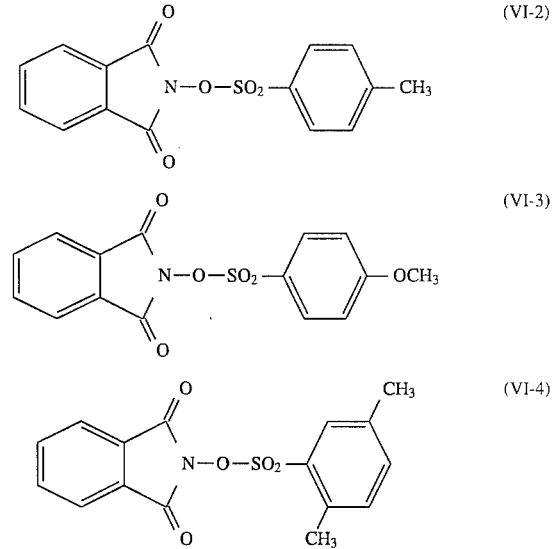

(VI-2)
(VI-3)
(VI-4)

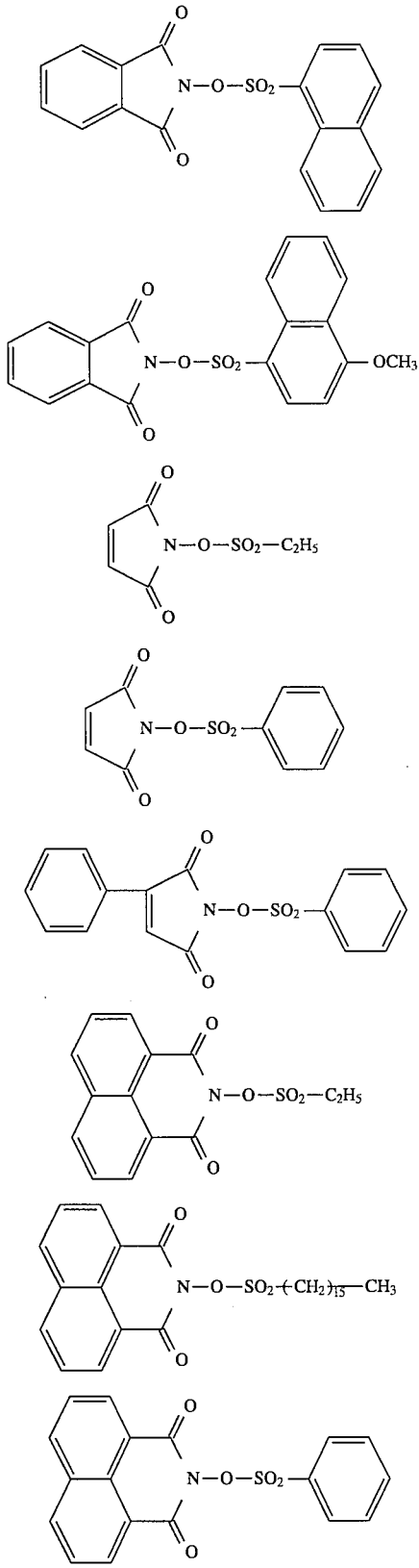

(VI-5)
(VI-6)
(VI-7)
(VI-8)
(VI-9)
(VI-10)
(VI-11)
(VI-12)

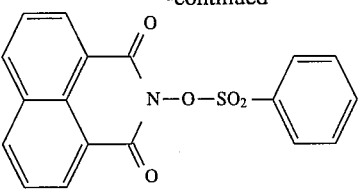

(VI-12)

In the composition of the present invention, the acid generating agent, compound (b), is used in an amount of from 0.01 to 20% by weight, preferably 0.3 to 10% by weight, and more preferably 1 to 5% by weight based on the total amount of solid matter. It is desirable that the absorption wavelength of the photo acid generating agent to be used sufficiently overlaps the exposing wavelength. Where they are not overlapped well, various spectral sensitizers can be added to compensate.

Concrete examples of such method are disclosed in, for example, JP-A-3-87748, U.S. Pat. No. 410201, and European Patent 422570A.

(3) Component (c) (a compound generating a base by heating)

The component (c) according to the present invention is a compound generating a base by heating. A heating temperature is 50° C. or more, preferably 70° C. or more, and more preferably 90° C. or more.

The compounds represented by the following formula (VII), (VIII) or (IX) are preferred embodiments of component (c).

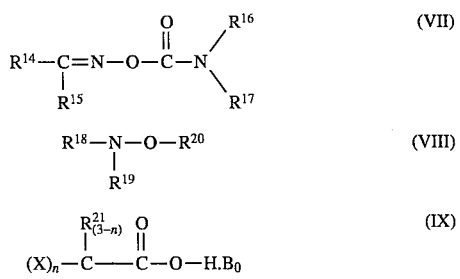

wherein $R^{14}$, $R^{15}$, $R^{16}$, and $R^{17}$ may be the same or different and each independently represents a hydrogen atom, an alkyl group, and an aryl group.

The alkyl group is linear, branched or cyclic and preferably is a group having 1 to 8 carbon atoms. Concrete examples include methyl, ethyl, propyl, butyl, hexyl, octyl, isopropyl, isobutyl, and 2-ethylhexyl. There are included in these alkyl groups, groups substituted with a halogen atom such as, for example, a chlorine atom, an alkoxy group having 1 to 6 carbon atoms such as, for example, methoxy, an aryl group such as, for example, phenyl, and an aryloxy group such as, for example, phenoxy. Specific examples include monochloromethyl, dichloromethyl, trichloromethyl, bromomethyl, 2-chloroethyl, 2-bromoethyl, 2-methoxyethyl, 2-ethoxyethyl, phenylethyl and phenoxymethyl.

The aryl group is preferably a monocyclic or dicyclic group, for example, phenyl, α-naphthyl, and β-naphthyl. Included in these aryl groups are a group substituted with an alkyl group having 1 to 6 carbon atoms such as, for example, methyl and ethyl, an alkoxy group having 1 to 6 carbon atoms such as, for example, methoxy and ethoxy, a halogen atom such as, for example, a chlorine atom, a nitro group, a phenyl group, and a cyano group. Specific examples include 4-chlorophenyl, 2-chloro-phenyl, 4-bromophenyl, 4-nitrophenyl, 4-phenylphenyl, 4-methylphenyl, 2-methylphenyl, 4-ethylphenyl, 4-methoxyphenyl, 2-methoxyphenyl, 4-ethoxyphenyl, 4-cyanophenyl, 4-methyl-1-naphthyl, 4-chloro-1-naphthyl, 5-nitro-1-naphthyl, 6-chloro-2-naphthyl, and 4-bromo-2-naphthyl.

$R^{18}$, $R^{19}$ and $R^{20}$ may be the same or different, and each independently represents a hydrogen atom, an alkyl group, an aryl group, an alkenyl group, and an acyl group.

The alkyl group and the aryl group for $R^{18}$, $R^{19}$ and $R^{20}$ has the same meanings as those defined for $R^{14}$ above, respectively.

The alkenyl group includes, for example, a vinyl group and a substituted alkenyl group including a vinyl group substituted with an alkyl group such as, for example, methyl and an aryl group such as, for example, phenyl. Specific examples are 1-methylvinyl, 2-methylvinyl, 1,2-dimethylvinyl, 2-phenylvinyl, 2-(p-methylphenyl) vinyl, 2-(p-methoxyphenyl) vinyl, and 2-(o-chlorophenyl) vinyl.

The acyl group is a group represented by $R^{22}$—C(=O)— or $Ar^5$—C(=O)—, wherein $R^{22}$ represents an alkyl group having 1 to 20 carbon atoms and $Ar^5$ represents an aryl group having 6 to 15 carbon atoms. There is included in these groups, a group substituted with a halogen atom, an alkoxy group, a nitro group, or a cyano group.

$R^{21}$ represents a hydrogen atom, an alkyl group, or an aryl group, and is preferably a hydrogen atom, an alkyl group having 1 to 8 carbon atoms, or an aryl group having 6 to 15 carbon atoms. To be specific, there is included as the alkyl group, methyl, ethyl, propyl, butyl, hexyl, octyl, isopropyl, isobutyl, and 2-ethylhexyl.

Examples of the aryl group include phenyl, α-naphthyl, and β-naphthyl.

X is a group consisting of atoms having a larger electronegativity than that of a carbon atom, known as an electron attractive group. Examples thereof include a halogen atom such as fluorine, chlorine and bromine, and groups such as nitro, nitroso, sulfoxide, sulfon, cyano, aryl, alkenyl, and alkynyl.

$B_0$ represents a primary, secondary or tertiary aliphatic, aromatic or heterocyclic amine compound, and formula (IX) represents a carboxylic acid salt of such amine.

n represents an integer of 1 to 3.

Further, $R^{14}$ and $R^{15}$, $R^{16}$ and $R^{17}$, and two groups of $R^{18}$, $R^{19}$ and $R^{20}$ may be combined to form a ring.

Concrete examples of component (c) used in the present invention are illustrated below, but the compounds which can be used for component (c) of the present invention are not limited thereto.

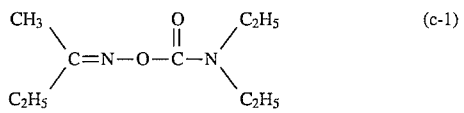 (c-1)

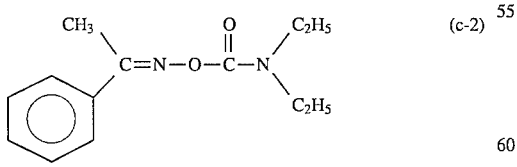 (c-2)

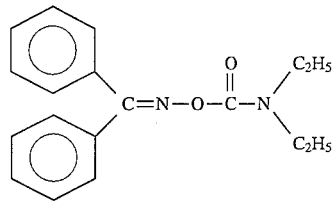 (c-3)

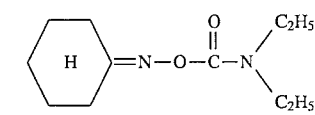 (c-4)

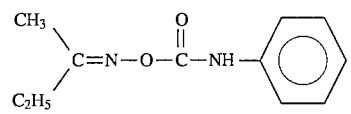 (c-5)

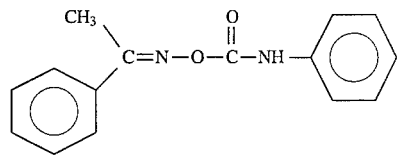 (c-6)

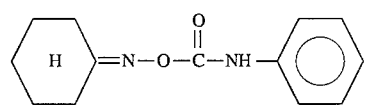 (c-7)

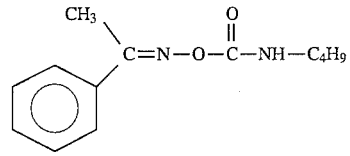 (c-8)

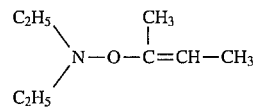 (c-9)

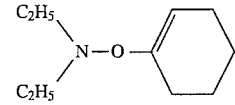 (c-10)

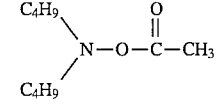 (c-11)

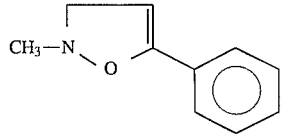 (c-12)

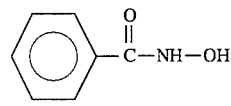 (c-13)

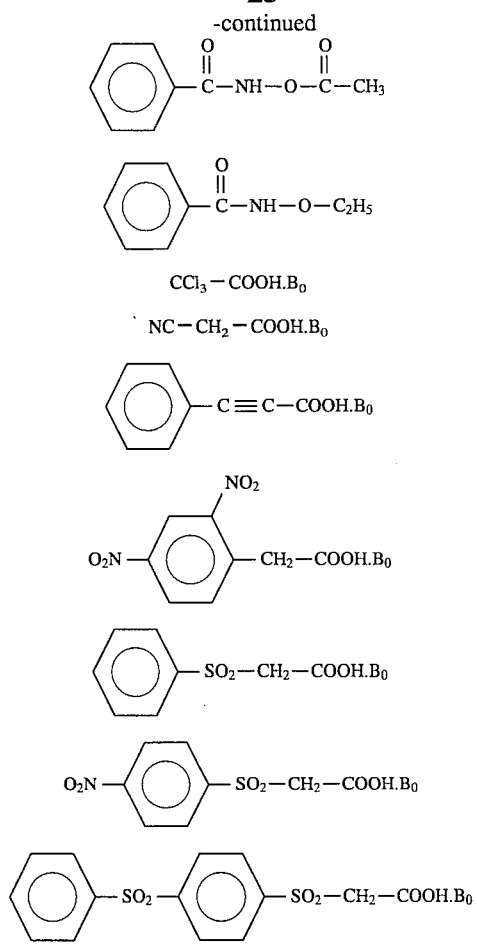

Wherein $B_0$ represents

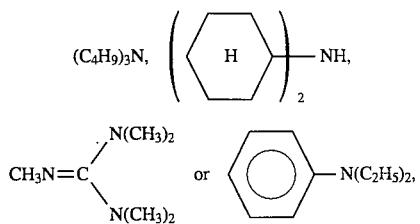

In the light-sensitive composition of the present invention, the content of the component (c) is $\frac{1}{1,000}$ to 10, preferably $\frac{1}{100}$ to 10, and more preferably $\frac{1}{20}$ to $\frac{1}{2}$ in terms of a mole ratio based on the amount of the above component (b).

(4) Component (a') (the acid curable compound)

The acid curable compound according to the present invention includes a compound which reduces solubility of a novolak resin in an alkali by a cross-linking or polymerization reaction in the presence of an acid catalyst or in combination thereof with heating. A typical example of such a compound is a compound having a methylol group or substituted methylol group as a formaldehyde precursor and includes a structure represented by the following formula:

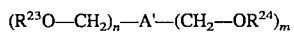

In the above formula, A' is a group represented by B' or B'—Y—B', and B' represents a substituted or unsubstituted mononuclear or condensed polynuclear aromatic hydrocarbon, or a heterocyclic compound containing oxygen, sulfur or nitrogen. Y represents a single bond, a $C_1$ to $C_4$ alkylene group, a substituted alkylene group, an arylene group, a substituted arylene group, an arylalkylene group, or an —O—, —S—, —SO$_2$—, —CO—, —COO—, —OCOO—, or —CONH— bond, or a substituted or unsubstituted alkylene group having these bonds at a portion thereof. Y may be a polymer such as a phenol resin.

$R^{23}$ and $R^{24}$ may be the same or different and each represents H, a $C_1$ to $C_4$ alkyl group, a cycloalkyl group, a substituted or unsubstituted aryl group, an alkyl group, an arylalkyl group, and an acyl group. n is an integer from 1 to 3 and m is an integer of 0 to 3.

Concrete examples of such a compound include various aminoblasts or phenoxyblasts, that is, a urea-formaldehyde resin, a melamine-formaldehyde resin, a benzoguanamine-formaldehyde resin, a glycol lauryl-formaldehyde resin, and a monomer or oligomer thereof. These are commercially available from many manufacturers for applications such as a vehicle for a paint. There can be given as a typical example thereof, for example, Cymel® 300, 301, 303, 350, 370, 380, 1116, 1130, 1123, 1125, and 1170 each manufactured by American Cyanamide Co., Ltd., and Nikalac® Mw 30, Mx 45, and Bx 4000 each manufactured by Sanwa Chemical Co., Ltd. These may be used singly or in combination of two or more.

There is available as another example, a methylolized or alkoxymethylated phenol derivative which can be a formaldehyde precursor. These may be used in the form of a monomer or resinified such as a cresol resin and a benzyl ether resin.

Another example of the acid curable compound is a compound having a silanol group, for example, the compounds disclosed in JP-A-2-154266 and JP-A-2-173647.

In the composition of the present invention, the acid curable compounds (a') is present in an amount of 1 to 60% by weight, preferably 3 to 40% by weight, and more preferably 10 to 30% by weight based on the entire amount of solid matter.

(5) Component (d) (the alkali soluble resin)

The water insoluble and alkali soluble-resin may be a polymer having an acidic hydrogen atom with a pKa of 11 or less, such as a phenolic hydroxide group, a carboxylic acid group, a sulfonic acid group, an imide group, a sulfonamide group, an N-sulfonylamide group, an N-sulfonylurethane group, and an active methylene group. Suitable alkali soluble polymers include, for example, a novolak phenol resin, a phenol-formaldehyde resin, an o-cresol-formaldehyde resin, a m-cresol-formaldehyde resin, a p-cresol-formaldehyde resin, a xylenol-formaldehyde resin, and a copolycondensation product. Further, there may be used in combination with the above phenol resins, a condensation product of phenol or cresol substituted with an alkyl group having 3 to 8 carbon atoms, and formaldehyde, such as a t-butylphenol-formaldehyde resin, as described in JP-A-50-125806. There can also be used a polymer comprising a phenolic hydroxy group-containing monomer as a copolymerizable component such as N-(4-hydroxyphenyl) methacrylamide, a homopolymer or copolymer of p-hydroxystyrene, o-hydroxystyrene, m-isopropenylphenol, and p-isopropenylphenol, and a polymer prepared by subjecting these polymers to a partial etherification or partial esterification.

Further, there can also be used as well a polymer comprising a carboxyl group-containing monomer such as acrylic acid and methacrylic acid as a copolymerizable component, a carboxyl group-containing polyvinylacetal resin described in JP-A-61-267042, and a carboxyl group-containing polyurethane resin described in JP-A-63-124047.

Further, there can be used as well a polymer consisting of N-(4-sulfamoylphenyl) methacrylamide, N-phenylsulfonyl methacrylamide and maleimide as a copolymerizable component, and an active methylene group-containing monomer described in JP-A-63-127237.

Of them, particularly preferred is a copoly-condensed novolak resin in which one or more kinds of m-cresol, p-cresol, o-cresol, and xylenols such as 2,5-xylenol and 3,5-xylenol are combined.

For manufacturing such a resin, for example, in the case of a m/p-cresol novolak resin, m-cresol and p-cresol are used as a monomer and both of these components are substantially copolycondensed with formaldehyde to thereby prepare the resin. In the above described m/p-cresol resin m-cresol is present in an amount of 20% by weight or more. The content of m-cresol is preferably 40% or more, more preferably 60% or more and 95% or less by weight.

Such novolak resins can be manufactured by various methods. For example, it is possible to apply the method in which a formalin aqueous solution is added to m-cresol and p-cresol each mixed in a prescribed proportion, and they are copolycondensed with triethylamine while suitably changing the amount of catalyst added.

Also, it can be manufactured by dissolving a monomer and paraformaldehyde in a non-polar solvent such as toluene and heating at high temperature under pressure.

There can be applied as well the method shown in the examples of JP-A-59-162542 and JP-A-60-159846, in which a salt of a divalent metal is used as a reaction catalyst.

These manufacturing methods correspond to known synthetic methods for high orthonovolak (novolak having a high content of ortho-ortho methylene linkage). Accordingly, in manufacturing a novolak resin, any of the methods for synthesizing high orthonovolak can be applied as a preferred method without being limiting to the above methods.

The weight average molecular weight of the novolak resin thus obtained is preferably from 1,000 to 30,000 in terms of a polystyrene conversion value which is measured with a gel permeation chromatography (GPC). A value of less than 1,000 increases layer reduction in the unexposed area after development, and a value exceeding 30,000 markedly lowers sensitivity. A particularly preferred range is 2,000 to 15,000.

In the novolak resin of the present invention, the resin obtained by a condensation reaction can be used by fractioning it to adjust the molecular weight distribution thereof. In particular, the resin in which the content of the dimer is adjusted to less than 15% by weight by removing part of most of a low molecular component including a dimer is preferably used since developability and heat resistance are particularly improved.

Methods for adjusting a dimer component include, for example, the method in which after synthesizing a novolak resin by a conventional method, it is dissolved in a polar solvent such as methanol, ethanol, acetone, methyl ethyl ketone, dioxane, and tetrahydrofuran, and then the solution is put in water or a water-polar solvent mixture to precipitate a resin component.

In an another method, while distillation under a reduced pressure is usually carried out at 150° to 200° C. after carrying out the reaction for a prescribed time in the synthesis of an alkali soluble resin to remove an unreacted monomer, formaldehyde and others, the distillation under a reduced pressure of 10 mm Hg or lower can be carried out at 230° C. or higher, preferably 250° C. or higher to efficiently distill off a dimer component.

These alkali soluble polymers can be used singly or may be used in a mixture of several kinds. The content of the component (d), when used in the positive type light-sensitive composition, is up to 97% by weight, preferably 10 to 95% by weight based on the amount of the whole solid matters contained in the light-sensitive material.

In the positive type light-sensitive composition of the present invention comprising the compounds (a), (b), (c) and, as needed, (d), the compounds (a), (b), (c) and as needed, (d) are combined so that the optical density of a layer of 1 μm formed by applying the composition becomes 1.4 or less, preferably 1.3 or less, and more preferably 1.0 or less at a wavelength of 248 nm.

In the negative type light-sensitive composition of the present invention, these alkali soluble resins (d) are present in a concentration necessary for forming a layer and are used in amounts of 40% by weight or more, preferably 60 to 95% by weight, and preferably 70 to 90% by weight based on the total amount of solid matter.

(5) Other preferred components

A dye, a pigment, a plasticizer, and a compound which increases photodecomposition efficiency (a so-called sensitizer) can be incorporated into the positive type light-sensitive composition of the present invention according to necessity.

There can be mentioned as such sensitizer, benzoin, benzoin methyl ether, benzoin ethyl ether, 9-fluorene, 2-chloro-9-fluorene, 2-methyl-9-fluorene, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino) phenylstyryl ketone, p-(dimethylamino) phenyl-p-methylstyryl ketone, benzophenone, p-(dimethylamino) benzophenone (or Michler's ketone), p-(diethylamino) benzophenone, and benzanthrone. It is particularly preferred to use the Michler's ketone.

Preferred sensitizer used in the present invention include the compound represented by formula (X), described in JP-B-51-48516:

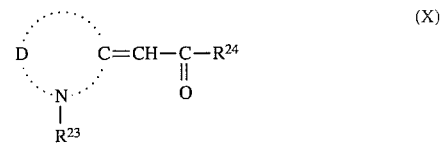

wherein $R^{23}$ represents an alkyl group (for example, methyl, ethyl, and propyl), or a substituted alkyl group (for example, 2-hydroxyethyl, 2-methoxyethyl, carboxymethyl, and 2-carboxyethyl); $R^{24}$ represents an alkyl group (for example, methyl, ethyl, and propyl), or an aryl group (for example, phenyl, p-hydroxyphenyl, naphthyl, and thienyl); D represents a group of atoms necessary for forming a nitrogen-containing heterocyclic nucleus which is usually used for a cyanine dye, for example, benzothiazoles (benzothiazole, 5-chlorobenzothiazole, and 6-chlorobenzothiazole), naphthothiazoles (α-naphthothiazole and β-naphthothiazole), benzoselenazoles (benzoselenazole, 5-chlorobenzoselenazole, and 6-methoxybenzoselenazole), naphthoselenazoles (α-naphthoselenazole and β-naphthoselenazole), benzoxazoles (benzoxazole, 5-methylbenzoxazole, and 5-phenylbenzoxazole), and naphthoxazoles (α-naphthoxazole and β-naphthoxazole).

Concrete examples of the compound represented by formula (X) are compounds having a chemical structure in which D, $R^{23}$ and $R^{24}$ are combined, and a lot of such compounds are publicly known. Accordingly, it can be suitably selected from these publicly known compounds.

Further, there can be used as a preferred sensitizer in the present invention, the sensitizers described in U.S. Pat. No. 4,062,686, for example, 2-[bis(furoyl)methylene]-3-methyl-benzothiazoline, 2-[bis(2-thiezoyl)methylene]-3-methyl-benzothiazoline, and 2-[bis(furoyl)methylene]-3-methyl-naphtho[1,2-d]thiazoline.

A dye can be used as a coloring agent, and an oil soluble dye and a base dye are available as a preferred dye. Examples include Oil Yellow #101, Oil Yellow #130, Oil Pink #312, Oil Green BG, Oil Blue BOS, Oil Blue #603, Oil Black BY, Oil Black BS, Oil Black T-505 (each manufactured by Orient Chemical Co., Ltd.), Crystal Violet (CI 42555), Methyl Violet (CI 42535), Rhodamine B (CI 45170B), Malachite Green (CI 42000), and Methylene Blue (CI 52015).

A low molecular aromatic polyhydroxy compound can be incorporated into the composition of the present invention for improving performance such as promoting dissolution in the developing solution, adjusting sensitivity, and others. There can be applied as such polyhydroxy compound, naphthoquinonediazide and a lot of the compounds known as a dissolution promoting additive for a positive type photoresist comprising a novolak resin. However, a usual range of a dissolution promoting effect, a sensitization effect and a layer reduction takes place at the same time in many cases and therefore the compounds having an optimum alkali solubility of the polyhydroxy compounds themselves are combined according to a photoresist composition to select a compound having least such problem.

There can be incorporated into the composition of the present invention for further increasing sensitivity, cyclic acid anhydride, a printing agent for obtaining a visible image immediately after exposing, and other fillers. As described in U.S. Pat. No. 4,115,128, available cyclic acid anhydrides include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylphthalic anhydride, succinic anhydride, and pyromellitic anhydride. These cyclic acid anhydrides can be added, in an amount of 1 to 15% by weight based on the total amount of solid matter contained in the composition, to raise sensitivity up to about three times. Examples of a printing agent for obtaining a visible image immediately after an exposure include a combination of a light-sensitive compound releasing acid by an exposure and an organic dye capable of forming a salt as the typical example thereof. Concrete examples are a combination of o-naphthoquinonediazide-4-sulfonic acid halogenide and a salt-forming organic dye, described in JP-A-50-36209 and JP-A-53-8128, and a combination of a trihalomethyl compound and a salt-forming organic dye, described in JP-A-53-36223 and JP-A-54-74728.

Solvent

When the light-sensitive composition of the present invention is used for a resist material for a semiconductor and other devices, it is dissolved in a solvent. Suitable solvents used in the present invention include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butylolacetone, toluene, and ethyl acetate. These solvents are used singly or in a mixture. The concentration thereof in the above components (the total amount of solid matter including the additives) is 2 to 50% by weight.

Actinic rays or radiation

Examples of actinic rays used for exposure of the light-sensitive composition of the present invention include a mercury lamp, a metal halide lamp, a xenon lamp, a chemical lamp, and a carbon arc lamp. Examples of radiation include an electron beam, X rays, an ion beam, and far UV rays. G rays, i rays and Deep-UV rays are preferably used as a light source for a photoresist. Further, a scanning or pulse exposure with a high density energy beam (a laser beam or an electron beam) can be used as well for exposing the light-sensitive composition of the present invention. Examples thereof include a laser beam, a helium/neon laser, an argon laser, a kripton ion laser, a helium/cadmium laser, and a KrF excimer laser.

Developing solution

There are suitably used as a developing solution used for the light-sensitive composition of the present invention, aqueous solutions of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and aqueous ammonia, and an organic alkali agent such as a tetralkylammonium OH salt. They are added so that the concentration thereof is 0.1 to 10% by weight, preferably 0.5 to 5% by weight.

Further, a surface active agent and an organic solvent such as alcohol can be added as well to the above alkaline solution according to necessity.

The present invention will be explained below in further detail with reference to examples, but the present invention is not in any way limited to these examples.

EXAMPLE 1

There were dissolved in ethyl lactate (8 g), a meta/para-cresol novolak resin (2 g) with an addition ratio of meta/para (m/p) set at 50/50 (by weight) and a molecular weight of about 6,000, a compound (0.7 g) represented by the following formula:

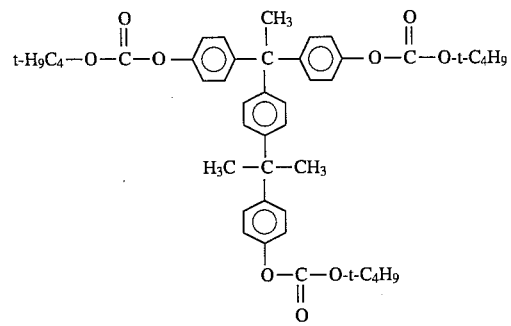

a sulfonium salt (0.05 g) having the structure shown by (IV-5), and the compound (0.02 g) shown by (c-2), followed by filtrating the solution with a membrane filter having a pore size of 0.4 μm, whereby a light-sensitive composition was obtained. An optical density of this composition was measured before exposure to find that it was 1.2 μm$^{-1}$ or less at a wavelength of 248 nm.

The above light-sensitive composition was coated on 3-inch bare silicon which was subjected to a treatment with hexamethyldisilazane, followed by subjecting it to a prebake on a hot plate maintained at 90° C. for 90 seconds, whereby a coated layer having a layer thickness of about 8,000 Å was formed. There was used for an exposure, a contact aligner PLA501F manufactured by Canon Co., Ltd., in which a low pressure mercury lamp was used as a light source and a band pass filter transmitting far UV rays with a wavelength of 254 nm was used. After exposing in a contact mode and heating at 110° C. for 60 seconds, paddle development was carried out in an aqueous tetramethylammonium hydroxide solution (hereinafter referred to as TMAH) with a concentration of about 2.4% for 60 seconds, whereby a positive image with a residual layer rate of 95% was obtained.

The Eta sensitivity was about 100 mJ/cm² and a resolution was 0.70 μmL/S.

EXAMPLES 2 TO 7

There were dissolved in ethyl lactate (8 g), a meta/para-cresol novolak resin (2 g) with an addition ratio of m/p set at 40/60 (by weight) and a molecular weight of about 4,500, a compound (0.7 g) represented by the following formula:

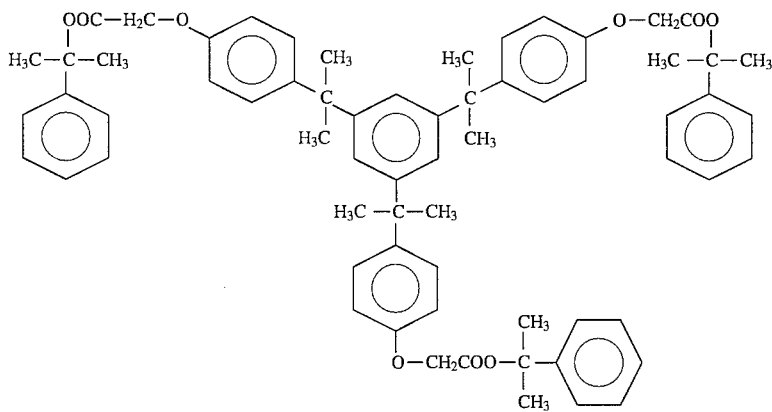

a disulfone compound (0.05 g) having the structure shown by (V-7), and the compound (corresponding to the component (c) according to the present invention) shown in Table 1, which generates a base by heating, and this solution was filtrated with a membrane filter having a pore size of 0.4 μm, whereby a light-sensitive composition was prepared. An optical density of this composition was measured to find that it was 1.2 μm$^{-1}$ or less in a wavelength of 248 nm in an unexposure.

A coated layer about 800 nm thick was formed on a silicon wafer and was subjected to an exposure and a development in the same manner as Example 1. In any examples, a minimum dimension 0.7 μm of a mask was resolved and a positive image having a residual layer rate of 90% or more was obtained.

In order to investigate the effect of processing conditions after exposure, the ratio of sensitivity, obtained by carrying out development 2 hours after exposure to sensitivity obtained by carrying out the development immediately after the exposure, was measured, and the results are shown in Table 1. Table 1 summarizes the results of a comparative example in which a coated layer was formed and exposed and developed in the same manner as Example 1, except that the component (c) according to the present invention was removed.

TABLE 1

| Composition and evaluation of the photoresist composition | | |
|---|---|---|
| | Component (c) | Sensitivity ratio* |
| Example 2 | (c-2) 0.043 g | 1.1 |
| Example 3 | (c-7) 0.042 g | 1.2 |
| Example 4 | (c-12) 0.029 g | 1.6 |
| Example 5 | (c-14) 0.033 g | 1.5 |
| Example 6 | (c-16) 0.053 g | 1.2 |
| Example 7 | (c-20) 0.060 g | 1.3 |
| Comparative Example 1 | — | 3.5 |

*Development 2 hours after exposure/development immediately after exposure.

The structure of the $B_0$ portion in (c-16) and (c-20) in Table 1 was:

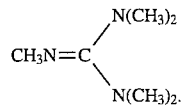

It can be seen from the results summarized in Table 1 that the compositions to which the components (c) according to the present invention were added have a small sensitivity variation in storage after an exposure as compared with the composition to which they were not added.

EXAMPLE 8

There were dissolved in ethyl cellosolve acetate (16.5 g), a meta/para-cresol novolak resin (2 g) with an addition ratio of m/p set at 50/50 (by weight) and a molecular weight of about 6000, Nikalac Mw 30® (manufactured by Sanwa Chemical Co., Ltd.) (1.25 g) containing a main component of methylolized melamine as an acid linking agent, a diphenyl iodonium PF$_6$ salt (0.15 g) as a photo acid generating agent, and the compound shown by (d-2) (0.04 g), and this solution was filtrated with a micro filter of 0.2 μm, whereby a photoresist composition was prepared. This photoresist composition was coated on a clean silicon wafer with a spinner and dried on a hot plate at 90° C. for 60 seconds, whereby a resist layer of 1 μm was obtained. This was exposed via a resolution mask with a reduction projection exposing equipment (i rays, a numerical aperture: 0.40)

while changing an exposure by stages. Then it was heated on a hot plate at 100° C. for 120 seconds and developed in an aqueous 2.4% by weight tetramethylammonium hydroxide (TMAH) solution, followed by further washing with water for 30 seconds and drying, whereby a positive image with a residual layer rate of 90% was obtained. An Eta sensitivity was about 75 mJ/cm² and a pattern of 0.5 μmL/S was resolved.

EXAMPLES 9 TO 14

There were dissolved in ethyl lactate (16.5 g), a meta/para-cresol novolak resin (5 g) with an addition ratio of m/p set at 60/40 (by weight) and a molecular weight of about 7500, an acid crosslinking agent (1.25 g) used in Example 8, a disulfone compound (0.15 g) having the structure shown by (V-7), and the compound (corresponding to the component (c) according to the present invention) shown in Table 2, which generates a base by heating, and this solution was filtrated with a micro filter of 0.2 μm, whereby a photoresist composition was prepared.

This composition was exposed, heated and developed in the same manners as Example 8.

Sensitivity was expressed by the exposure at which the residual layer rate of the resist at an irradiated-portion after a development became 90%. A fine pattern of the resist on the wafer, which was obtained with this exposure, was observed with a scanning type electron microscope (SEM) to evaluate a resolution by a minimum dimension obtained when a depth of the pattern of the resist reached a substrate surface.

In order to investigate the effect of the processing conditions after an exposure, there was measured a ratio of a sensitivity obtained by carrying out a development 2 hours after an exposure to a sensitivity obtained by carrying out the development immediately after the exposure, and the results are shown in Table 2. There are shown in Table 2 altogether the results of a comparative example in which a coated layer was formed and exposed and developed in the same manner as Example 8 except that the component (c) of the present invention was removed.

TABLE 2

| | Composition and evaluation of the photoresist composition | | |
|---|---|---|---|
| | Component (c) | Resolution | Sensitivity ratio* |
| Example 9 | (c-2) 0.043 g | 0.5 μm | 1.2 |
| Example 10 | (c-7) 0.042 g | 0.5 μm | 1.4 |
| Example 11 | (c-12) 0.029 g | 0.5 μm | 1.7 |
| Example 12 | (c-14) 0.033 g | 0.55 μm | 1.4 |
| Example 13 | (c-16) 0.053 g | 0.5 μm | 1.3 |
| Example 14 | (c-20) 0.060 g | 0.55 μm | 1.2 |
| Comp. Example 2 | — | 0.55 μm | 4.0 |

*Development 2 hours after exposure/development immediately after exposure.

The structure of the $B_0$ portion in (c-16) and (c-20) in Table 2 was:

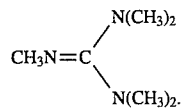

It can be seen from the results summarized in Table 2 that the compositions to which the component (c) according to the present invention were added have a small sensitivity variation by storage after an exposure compared with the composition to which they were not added.

The light-sensitive composition of the present invention has a high sensitivity and a conformation with a light source of a short wavelength in a Deep-UV region as well as an excellent resolution.

Further, the effect of processing after exposure until development is small.

While the invention has been described in detail and with reference to specific embodiments thereof, it will be apparent to one skilled in the art that various changes and modifications can be made therein without departing from the spirit and scope thereof.

What is claimed is:

1. A light-sensitive composition, comprising:
   (a) a compound having at least one group capable of decomposing by acid to form an acid decomposed compound, wherein the acid decomposed compound is more soluble in an alkaline developing solution than the compound having at least one group capable of decomposing by acid,
   (b) a compound which generates acid by irradiation with actinic rays, and
   (c) a compound which generates a base at a temperature of at least 50° C.

2. The light-sensitive composition of claim 1, further comprising:
   (d) a resin, the resin being insoluble in water and soluble in an alkaline aqueous solution.

3. A light-sensitive composition as in claim 1, wherein component (a) has a molecular weight of 2000 or less.

4. A light-sensitive composition as in claim 1, wherein component (c) is present in an amount of 1/1000 to 10 in terms of mole ratio based on the amount of component (b).

5. A light-sensitive composition as in claim 4, wherein component (c) is present in an amount of 1/20 to 1/2 in terms of mole ratio based on the amount of component (b).

6. The light-sensitive composition of claim 1, wherein component (a) is a compound containing an acid decomposable group selected from the group consisting of —COO—A and —Ar—O—B, wherein A represents a —C(R¹)(R²)(R³) group, a —Si(R¹)(R²)(R³) group or a —C(R⁴)(R⁵)(OR⁶) group; B is the same as A or is a —COO—A group; $R^1$, $R^2$, $R^3$, $R^4$ and $R^5$ are the same or different and each represents a hydrogen atom, an alkyl group, a cycloalkyl group, an alkenyl group or an aryl group; Ar represents a monocyclic or polycyclic divalent aromatic group; and $R^6$ represents an alkyl group or an aryl group; provided at least two of $R^1$, $R^2$ and $R^3$ are groups other than a hydrogen atom.

7. The light-sensitive composition of claim 1, wherein component (c) is a compound which generates a base at a temperature of at least 70° C.

8. The light-sensitive composition of claim 7, wherein component (c) is a compound which generates a base at a temperature of at least 90° C.

9. The light-sensitive composition of claim 1, wherein component (c) is a compound having a formula represented by formula VII, VIII or IX:

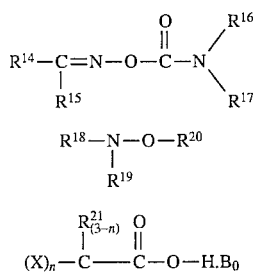

$$R^{18}-N-O-R^{20} \quad \text{VIII}$$
$$\quad\ \ |$$
$$\quad\ R^{19}$$

$$\begin{array}{c} R^{21}_{(3-n)} \quad O \\ | \quad\quad\ \ \| \\ (X)_n-C-\!\!-\!\!-C-O-H.B_0 \end{array} \quad \text{IX}$$

wherein $R^{14}$, $R^{15}$, $R^{16}$ and $R^{17}$ are the same or different and each independently represents a hydrogen atom, an alkyl group or an aryl group;

$R^{18}$, $R^{19}$ and $R^{20}$ are the same or different and each independently represents a hydrogen atom, an alkyl group, an aryl group, an alkenyl group or an acyl group;

$R^{21}$ represents a hydrogen atom, an alkyl group or an aryl group;

X is an electron attractive group;

$B_0$ represents a primary, secondary, or tertiary aliphatic, aromatic or heterocyclic amine; and n represents an integer of 1 to 3.

10. A light sensitive composition, comprising:

(a) a compound having at least one group capable of decomposing by acid to form an acid decomposed compound, wherein the acid decomposed compound is more soluble in an alkaline developing solution than the compound having at least one group capable of decomposing by acid, and the acid decomposable group is selected from the group consisting of —COO—A and —Ar—O—B, wherein A represents a —C($R^1$) ($R^2$) ($R^3$) group, a —Si($R^1$) ($R^2$) ($R^3$) group or a —C($R^4$) ($R^5$) (O$R^6$) group; B is the same as A or is a —COO—A group; $R^1$, $R^2$, $R^3$, $R^4$ and $R^5$ are the same or different and each represents a hydrogen atom, an alkyl group, a cycloalkyl group, an alkenyl group or an aryl group; Ar represents a monocyclic or polycyclic divalent aromatic group; and $R^6$ represents an alkyl group or an aryl group; provided at least two of $R^1$, $R^2$ and $R^3$ are groups other than a hydrogen atom, and at least two of $R^1$, $R^2$ and $R^3$ are combined to form a ring, (b) a compound which generates acid by irradiation with actinic rays, and (c) a compound which generates a base at a temperature of at least 50° C.

11. A light sensitive composition, comprising:

(a) a compound having at least one group capable of decomposing by acid to form an acid decomposed compound, wherein the acid decomposed compound is more soluble in an alkaline developing solution than the compound having at least one group capable of decomposing by acid, and the acid decomposable group is selected from the group Consisting of —COO—A and —Ar—O—B, wherein A represents a —C($R^1$) ($R^2$) ($R^3$) group, a —Si($R^1$) ($R^2$) ($R^3$) group or a —C($R^4$) ($R^5$) (O$R^6$) group; B is the same as A or is a —COO—A group; $R^1$, $R^2$, $R^3$, $R^4$ and $R^5$ are the same or different and each represents a hydrogen atom, an alkyl group, a cycloalkyl group, an alkenyl group or an aryl group; Ar represents a monocyclic or polycyclic divalent aromatic group; and $R^6$ represents an alkyl group or an aryl group; provided at least two of $R^1$, $R^2$ and $R^3$ are groups other than a hydrogen atom, and at least two of $R^4$, $R^5$ and $R^6$ are combined to form a ring, (b) a compound which generates acid by irradiation with actinic rays, and (c) a compound which generates a base at a temperature of at least 50° C.

* * * * *